United States Patent [19]

Koon

[11] 4,374,665
[45] Feb. 22, 1983

[54] MAGNETOSTRICTIVE DEVICES

[75] Inventor: Norman C. Koon, Woodbridge, Va.

[73] Assignee: The United States of America as represented by the Secretary of the Navy, Washington, D.C.

[21] Appl. No.: 314,327

[22] Filed: Oct. 23, 1981

[51] Int. Cl.$^3$ .............................................. C22C 33/00
[52] U.S. Cl. ................................ 75/123 E; 73/862.36; 73/862.69; 73/DIG. 2; 101/DIG. 5; 148/403; 179/110 C; 310/26; 420/435; 420/440
[58] Field of Search ............. 75/123 B, 123 E, 123 F, 75/123 A, 123 N, 123 K, 123 L, 124 R, 124 B, 124 C, 124 E, 124 F, 134 N, 134 B, 134 F, 134 T, 134 M, 134 S, 134 P, 170; 101/DIG. 5; 148/403, 408, 425; 420/416, 435, 455, 440; 310/26; 73/862.36, 862.69, DIG. 2; 179/110 C

[56] References Cited

U.S. PATENT DOCUMENTS

| | | | |
|---|---|---|---|
| 4,065,330 | 12/1977 | Matsumoto et al. | 148/121 |
| 4,126,494 | 11/1978 | Imamura et al. | 75/123 E |
| 4,134,779 | 1/1979 | Ray et al. | 148/121 |
| 4,226,619 | 10/1980 | Hatta et al. | 75/123 K |
| 4,249,969 | 2/1981 | DeCristofaro et al. | 148/108 |
| 4,264,358 | 4/1981 | Johnson et al. | 75/134 F |
| 4,290,805 | 9/1981 | Gorgerino et al. | 75/134 S |

FOREIGN PATENT DOCUMENTS

| | | |
|---|---|---|
| 51-73923 | 6/1976 | Japan . |
| 56-41345 | 4/1981 | Japan . |
| 56-72153 | 6/1981 | Japan . |

OTHER PUBLICATIONS

*Crystalline Electric Field and Structural Effects in f-Electron Systems,* "Magnetic Anisotropy and Spin Reorientation in Ho$_x$Tb$_{1-x}$Fe$_2$,D$_{yx}$Tb$_{1-x}$Fe$_2$ and Ho$_x$Tb$_y$D$_{y1-x-y}$Fe$_2$", Koon et al., pp. 75–82, 1980.
Koon et al, "Giant Magnetostriction in Cubic Rare Earth–Iron Compounds of the Type RFe$_2$", Physics Letters, vol. 37A, #5, Dec. 20, 1971, pp. 413 and 414.

*Primary Examiner*—John P. Sheehan
*Attorney, Agent, or Firm*—Robert F. Beers; William T. Ellis; Thomas E. McDonnell

[57] ABSTRACT

A magnetostrictive device comprises a magnetostrictive component consisting essentially of an amorphous alloy of iron, boron, lanthanum and lanthanide.

20 Claims, 2 Drawing Figures

MAGNETOSTRICTIVE DEVICES

BACKGROUND OF THE INVENTION

The invention pertains generally to magnetostrictive devices and in particular to components to magnetostrictive devices prepared from iron-boron-rare earth alloys.

Electrical signals can be converted into mechanical displacements, or the reverse, using the magnetostrictive effect by placing a magnetostrictive material in the magnetic field of a solenoid. A changing current in the solenoid changes the magnetic state of the magnetostrictive material, thereby changing its physical dimensions. Conversely, a change in the physical dimension induces a voltage and/or current in the solenoid. Very important properties of a magnetostrictive material are the size of the magnetostrictive effect and how much applied magnetic field is required to achieve it. In general a good magnetostrictive material has high electrical resistivity, low magnetic anisotropy, large magnetization, and large isotropic magnetostriction. All crystalline materials have some magnetic anisotropy as well as magnetostriction which is not perfectly isotropic.

The largest room temperature magnetostrictive strains are exhibited by rare earth-iron Laves phase (RFe$_2$) intermetallic compounds, disclosed in Koon et al. *Phys. Lett.* 37A:5, p. 413 (1971). In *Crystalline Electric Field and Structural Effects in f-Electron Systems* J. E. Crow et al. eds. Plenum, N.Y. 1981, pp. 75–82, it is taught that the magnetic anisotropy of such compounds can be made small by employing special combinations of elements, such as Ho$_{.58}$Tb$_{.20}$Dy$_{.22}$Fe$_2$. However, this and other similar alloys also have the problem that their magnetostrictive is very anisotropic, with large strains occuring along the (111) direction and very small ones along (100). To produce a large magnetostrictive effect in such an alloy with very low applied magnetic fields requires using either a single crystal or a highly textured polycrystalline sample. Generally alloys which do not contain rare earth elements have much smaller magnetostrictive strains than those exhibited by the rare earth-iron Laves phase (RFe)$_2$ compounds. Disadvantages of the RFe$_2$ compounds are they must contain 33⅓ at. % rare earth, which is expensive; they must employ special combinations of rare earths to reduce magnetic anisotropy; and generally they must employ very high purity materials, which adds to the expense. They also need to be textured, which adds extra processing expense.

Since amorphous magnetic alloys are inherently isotropic, these alloys would avoid these problems. Unfortunately amorphous magnetic alloys are difficult to produce and they generally have poor magnetostriction. Amorphous magnetic alloys between strongly magnetic transition metals and the rare earth elements can be prepared by several methods. Among the easiest are coevaporation or sputtering onto cold substrates. Such methods, however, produce very small amounts of material with very high bulk costs, and are not practical for most applications. For use in applications where bulk quantities are required, some method involving rapid quenching from the melt is necessary. Because of the much slower quench rate from a liquid compared to that from sputtering or evaporation, most amorphous melt quenched alloys are at compositions near deep eutectics in the phase diagrams. For rate earth-transition metal alloys the deep eutectic points occur near R$_{.65}$TM$_{.35}$, so that such amorphous alloys contain large amounts of rare earth and smaller amounts of the transition metals. This is unsatisfactory for at least two reasons. The first is that the strength of the exchange interactions depend on the amount of transition metal, so that all such alloys have relatively low magnetic transition temperatures and are thus not very useful at room temperature. Second is that the rare earth component of the alloy is expensive, so that an alloy containing mostly rare earth is very costly. To preserve the strength of the magnetic interactions it is generally necessary to have an alloy containing mostly transition metals, and thus having a binary composition very far from the eutectic (and thus very difficult to make). Thus, until now, it was necessary to chose between excellent but expensive magnetostrictive devices and moderately good and moderately expensive magnetostrictive devices.

SUMMARY OF THE INVENTION

It is, therefore, an object of this invention to increase the performance of magnetostrictive devices without increasing the cost of the devices.

Another object of this invention is to manufacture magnetostrictive devices having components made from magnetic alloys which are amorphous, have high magnetic moments, exhibit large isotropic magnetostriction, have high electrical resistivity, and can be prepared in bulk quantities by melt spinning techniques, such as melt-quenching.

These and other objects are achieved by selecting an alloy in the manufacture of magnetostrictive devices that has a small amount of rare earth elements added to an alloy between a strongly magnetic transition metal and a second element such as boron, where the glass forming deep eutectic composition is known to contain mostly transition metal.

DETAILED DESCRIPTION OF THE INVENTION

Figure 1:
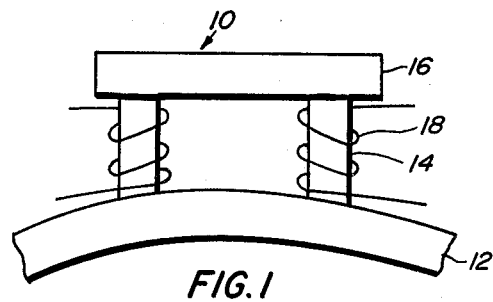
FIG. 1 is a schematic of a magnetostrictive device.

The amorphous alloys from which the magnetostrictive devices are prepared are represented by the formula:

(M$_w$X$_x$B$_{1-w-x}$)$_{1-y}$(R$_z$La$_{1-z}$)$_y$ wherein w is from about 0.7 to about 0.9; x is from 0 to about 0.10; y is from about 0.05 to about 0.15; z is from 0 to about 0.95; M is selected from the class consisting of iron, cobalt, an iron-cobalt alloy, an iron-manganese alloy having at least 50 atomic percent iron, an iron-cobalt-manganese alloy having at least 50 atomic percent iron and cobalt; X is a glass former selected from the class consisting of phosphorous, arsenic, germanium, gallium, indium, antimony, bismuth, tin, carbon, silicon, and aluminum, and R is a lanthanide selected from the class consisting of promethium, samarium, terbium, dysprosium, holmium, erbium thulium, and mixtures thereof.

It has been determined lanthanum must be present in order to obtain an amorphous alloy comprising iron, boron, and the aforementioned lanthanides in the above amounts. It is possible to alloy about two atomic percent of samarium with iron and boron and still obtain an amorphous alloy by techniques similar to melt-quenching.

The preferred lanthanides are samarium, terbium, dysprosium, holmium, and erbium. The most preferred lanthanides are terbium, dysprosium and holmium.

The amount of the lanthanide (R) relative to the amount of lanthanum is from 0 to about 0.95. Since the advantageous properties arise from the inclusion of a lanthanide (R) other than lanthanum, an amount less than 0.3 for the lanthanide is not preferred. On the other hand, an amorphous alloy is not obtainable without lanthanum; so, alloys with a lanthanide in excess of 0.75 would be difficult to prepare. These alloys would require a large amount of an auxillary glass former, a higher amount of boron, and careful processing in order to obtain an amorphous microstructure. The most preferred range for the lanthanide is from 0.5 to 0.75.

Iron is the preferred metal for M. Other elements and alloys can also be used, such as cobalt, iron-cobalt alloys, and iron-manganese alloys. The preferred range for w is 0.74 to 0.86 and the most preferred range is from 0.78 to 0.84. The alloys are represented as: (1) $Fe_aCo_{1-a}$ wherein $0.01 \leq a < 0.99$ and preferably $0.5 < a < 0.95$; (2) $Fe_bM_{1-b}$ wherein $0.5 < b < 1.0$ and preferably $0.7 < b < 0.95$; (3) $Fe_dCo_eMn_{1-d-e}$ where $(d+e)0.5 < (d+e) < 1.0$ and preferably $0.75 < (d+e) < 0.95$ and d is greater than e and preferably is more than two times greater than e.

The auxillary glass formers increase the amount of lanthanide which can be included without eliminating the amorphous microstructure. The most common glass formers are phosphorous, silicon, carbon, arsenic, germanium, aluminum, indium, antimony, bismuth, tin, and mixtures thereof. The preferred glass formers are phosphorus, carbon, silicon, and aluminum. The amount of glass former which can be added is from about 0 to about 0.10.

The amount of lanthanum and lanthanide is from about 0.05 to about 0.15 of the total alloy and preferably is from 0.05 to 0.10. It is possible to form alloys with a lanthanum-lanthanide amount greater than 0.15, depending on the lanthanide, the relative amounts of the transition metal or alloy therefrom, the presence of a auxillary glass former, and the processing parameters. The upper limit of 0.15 represents a general limit, which assures the preparation of an amorphous alloy.

The method of preparation is critical to the formation of the amorphous microstructure. It is critical that after the alloy is formed, the molten alloy is cooled at a rate of at least $5 \times 10^4$ C/sec and preferably at least $1 \times 10^6$ C/sec.

In preparing the alloys of this invention, it is preferred that the starting materials have at least three 9's purity and preferably at least four 9/s purity. The starting materials are melted in an inert atmosphere, e.g. vacuum, argon, helium, or other noble gas. Presently only thin sections of the molten alloy can be cooled rapidly enough. Examples of techniques for cooling thin sections include ejecting molten alloy onto a rapidly rotating inert surface. e.g., a highly polished copper wheel, ejecting molten alloy between two counterrotating rollers vapor deposition or electrolytic deposition on a cold surface. The preferred technique is ejecting the molten alloy onto the surface of a polished copper wheel rotating at a rate of at least 2000 rev/min. Further details on the preparation of these alloys are found in Applicant's co-pending application filed on Oct. 23, 1981 for SOFT MAGNETIC ALLOYS AND PREPARATION THEREOF which is herein incorporated by reference.

A magnetostrictive device has at least one magnetostrictive component which varies in physical size with a variation in the magnetic field surrounding the component or charges the magnetic field with a charge in physical size. Common magnetostrictive devices include transducers, variable delay lines, variable frequency, oscillators, and filters.

Magnetostrictive devices having components prepared from the above alloys are manufactured and designed in the same manner as previously. FIG. 1 is a cross-sectional view of a transducer 10 from a transducer array. The transducer comprises a base 12, two magnetostrictive components 14 attached to the base, a head 16 attached to the magnetostrictive components, and an electrical coil 16 around each magnetostrictive component and attached to an AC electrical source. The base and head are fabricated from a soft magnetic material so that a magnetic circuit is established. The transducer operates by passing current through the coils which generates a magnetic field and in turn causes the magnetostrictive components to change in size. Since the base is fixed, the head moves, sending out a signal.

Having described the invention generally, the following discussion and example are given to demonstrate the magnetostriction of the aforementioned alloys and thus the operability devices prepared therefrom.

Figure 2:
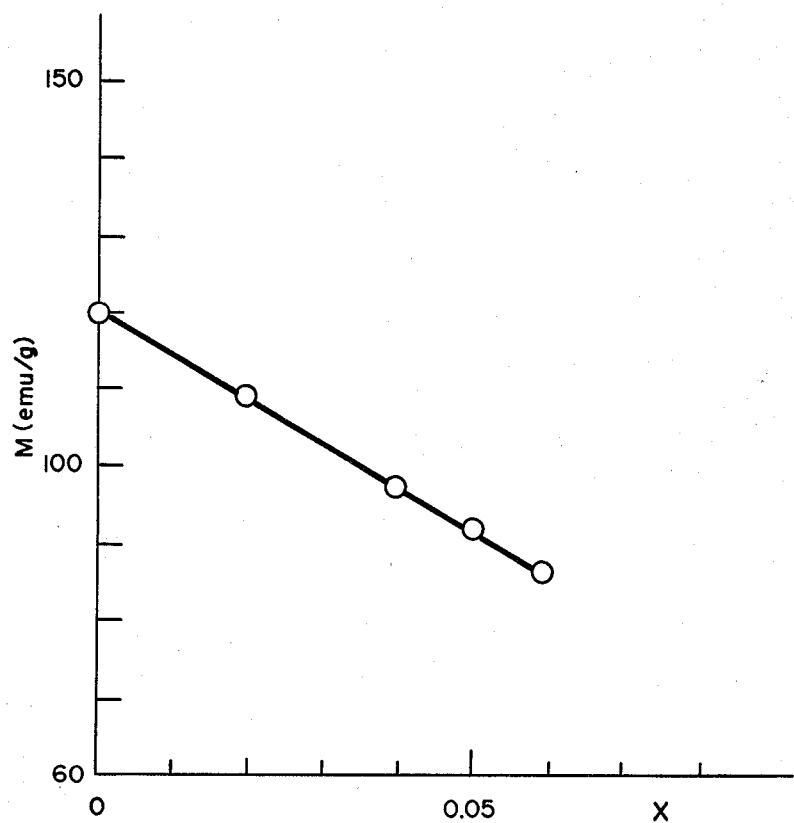
FIG. 2 shows the variation of magnetization with the amount of lanthanum in (Fe$_{.82}$B$_{.18}$)$_{.9}$Tb$_x$La$_{.1-x}$.

The exchange coupling to the rare earth is large which indicates a large magnetostrictive strain. FIG. 2 is a graph of the variation of the saturation magnetization of $(Fe_{.82}B_{.18})_{.9}Tb_xLa_{.1-x}$ with the amount of terbium, saturation magnetization being the largest magnetization for a given material. Magnetization was measured by using a vibrating sample magnetometer calibrated against a nickel sample. The magnetic moments of the sample was measured at 300 K by replacing the nickel standard with a sample of $(Fe_{.82}B_{.18})_{.9}Tb_xLa_{.1-x}$ and by measuring the moment as a function of applied magnetic field.

The slope of the line in FIG. 2 gives the relative magnetization of terbium and is designated as m. For FIG. 2, the value of m is about 0.6.

According to the Callen and Callen Theory, the cube of the ratio of the relative magnetization of a given sample with a known sample, e.g. $TbFe_2$, is the magnetostriction number at saturation. For the present sample, this calculation yields a magnetostrictive strain of about 190 to $240 \times 10^{-6}$. This strain exceeds the largest magnitostriction ($40-50 \times 10^{-6}$) available in non-rare-earth-containing amorphous alloys.

Obviously many modifications and variations of the present invention are possible in light of the above teachings. It is therefore to be understood that within the scope of the appended claims the invention may be practiced otherwise than as specifically described.

What is claimed and desired to be secured by letters patent of the United States is:

1. In a magnetostrictive device, the improvement comprising a magnetostrictive component consisting essentially of an amorphous alloy represented by the formula:

$(M_wX_xB_{1-w-x})_{1-y}(R_zLa_{1-z})$ where w is from about 0.7 to about 0.9; x is from 0 to about 0.10; y is from about 0.05 to 0.15; z is from 0 to about 0.95; M is selected from the class consisting of iron, cobalt, an iron-cobalt alloy, an iron-manganese alloy having at least 50 atomic percent iron, an iron-cobalt-manganese alloy having at least 50 percent iron and cobalt, X is a auxillary glass former selected from the class consisting of phosphorous, carbon, silicon, aluminum, arsenic, germanium, indium, antimony, bismuth, tin, and mixtures thereof, and R is a lanthanide selected from the class consisting of promethium, samarium, terbium, dysprosium, holmium, erbium thulium, and mixtures thereof.

2. The device of claim 1 wherein M is iron.

3. The device of claim 2 wherein R is selected from the class consisting of samarium, terbium, dysprosium, holmium, erbium, and mixtures thereof.

4. The device of claim 2 wherein R is selected from the class consisting of terbium, dysprosium, holmium, and mixtures thereof and z is from 0.5 to 0.75.

5. The device of claim 3 wherein w is from 0.74 to 0.86.

6. The device of claim 5 wherein w is from 0.78 to 0.84.

7. The device of claim 2 wherein z is from 0.30 to 0.75.

8. The device of claim 7 wherein z is from 0.5 to 0.75.

9. The device of claim 7 wherein x is 0 and y is from 0.05 to 0.10.

10. The device of claim 1 wherein M is cobalt and R is selected from the class consisting of promethium, samarium, terbium, dysprosium, holmium, erbium, thulium and mixtures thereof.

11. The device of claim 10 where R is selected from the class consisting of terbium, dysprosium, holmium and mixtures thereof.

12. The device of claim 11 wherein w is from 0.78 to 0.84, z is from 0.5 to 0.75, and y is from 0.05 to 0.10.

13. The device of claim 12 wherein x is 0.

14. The device of claim 1 wherein M represents $Fe_a Co_{1-a}$ and a is from about 0.01 to about 0.99.

15. The device of claim 14 wherein R is selected from the class consisting of samarium, terbium, dysprosium, holmium, erbium and mixtures thereof and a is from 0.5 to 0.75.

16. The device of claim 15 wherein x is zero and R is selected from the class consisting of terbium, dysprosium, holmium, and mixtures thereof.

17. The device of claim 1 wherein M represents the formula $Fe_b Mn_{1-b}$ wherein $0.5 \leq b < 1.0$.

18. The device of claim 17 wherein $0.7 \leq b < 0.95$.

19. The device of claim 1 wherein M represents $Fe_d Co_e Mn_{1-d}$ where $0.5 < (d+e) < 1.0$ and $d > e$.

20. The device of claim 19 wherein $0.75 < (d+e) < 0.95$ and $d > 2e$.

* * * * *